US012126056B2

United States Patent
Holcomb et al.

(10) Patent No.: US 12,126,056 B2
(45) Date of Patent: Oct. 22, 2024

(54) DEPASSIVATING CIRCUITRY FOR SENSOR BATTERIES

(71) Applicant: Cisco Technology, Inc., San Jose, CA (US)

(72) Inventors: Kevin William Holcomb, Apex, NC (US); Aumen Kwok Lee, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 89 days.

(21) Appl. No.: 17/876,169

(22) Filed: Jul. 28, 2022

(65) Prior Publication Data

US 2024/0039009 A1 Feb. 1, 2024

(51) Int. Cl.
*H01M 6/50* (2006.01)
*G01R 31/36* (2020.01)
*G01R 31/389* (2019.01)
*G01R 33/07* (2006.01)
*H01M 10/44* (2006.01)

(52) U.S. Cl.
CPC ...... *H01M 6/5088* (2013.01); *G01R 31/3648* (2013.01); *G01R 31/389* (2019.01); *G01R 33/07* (2013.01); *H01M 10/44* (2013.01)

(58) Field of Classification Search
None
See application file for complete search history.

(56) References Cited

U.S. PATENT DOCUMENTS

| | | | |
|---|---|---|---|
| 6,118,251 A * | 9/2000 | Atwater | H02J 7/00711 320/131 |
| 9,570,934 B2 | 2/2017 | Venkataramani et al. | |
| 10,141,581 B2 | 11/2018 | Klewer et al. | |
| 11,112,460 B2 | 9/2021 | Feltham et al. | |
| 2011/0156497 A1* | 6/2011 | Karren | H01M 10/48 307/139 |
| 2015/0171655 A1* | 6/2015 | Venkataramani | H02J 7/0069 320/131 |

(Continued)

FOREIGN PATENT DOCUMENTS

| CN | 102637911 | 5/2014 |
|---|---|---|
| GB | 2305557 | 4/1997 |

OTHER PUBLICATIONS

"Wireless Temperature and Humidity Sensor—R718AB—User Manual", Model: R718AB, online: http://www.netvox.com.tw/um/R718AB/R718ABUsermanual.pdf, accessed May 18, 2022, 14 pages, Netvox.

(Continued)

*Primary Examiner* — Jas A Sanghera
(74) *Attorney, Agent, or Firm* — BEHMKE INNOVATION GROUP LLC; James M. Behmke; James J. Wong

(57) ABSTRACT

In one embodiment, a depassivating circuit includes a battery, a resistive load coupled to the battery, and a magnetic field sensor. The magnetic field sensor detects a presence of a magnetic field. The magnetic field sensor depassivates the battery by causing current from the battery to flow through the resistive load, in response to the presence of the magnetic field. The magnetic field sensor detects removal of the magnetic field. The magnetic field sensor ends depassivation of the battery, in response to the removal of the magnetic field.

20 Claims, 6 Drawing Sheets

(56) References Cited

U.S. PATENT DOCUMENTS

2019/0237739 A1* 8/2019 Dalgleish .............. H01M 10/48
2021/0242546 A1 8/2021 Dalgleish

OTHER PUBLICATIONS

"Information on Battery Passivation", Technical Note, online: https://www.datasci.com/docs/default-source/technical-notes/physioteldigital_batterypassivation.pdf?sfvrsn=4, accessed May 18, 2022, 1 page, Data Sciences International.
"Depassivation Unit for 1/2 AA Cells", online: https://www.securasound.co.uk/product/529/7284/depassivation-unit-for-12-aa-cells, accessed May 18, 2022, 4 pages.
Keith, Alex, "Automatic Pet Door with Magnetic Field Activation", online: https://digitalcommons.linfield.edu/cgi/viewcontent.cgi?article=1050&context=studsymp_sci, accessed May 18, 2022, 1 page.
"Passivation of Lithium Thionyl Chloride Batteries", online, May 20, 2020, accessed Jul. 22, 2022, 4 pages, Jauch.com.

* cited by examiner

DEPASSIVATING CIRCUITRY FOR SENSOR BATTERIES

TECHNICAL FIELD

The present disclosure relates generally to computer networks, and, more particularly, to depassivating circuitry for sensor batteries.

BACKGROUND

The Internet of Things, or "IoT" for short, represents an evolution of computer networks that seeks to connect many everyday objects to the Internet. Notably, there has been a recent proliferation of 'smart' devices that are Internet-capable such as thermostats, lighting, televisions, cameras, and the like. In many implementations, these devices may also communicate with one another. For example, an IoT motion sensor device may communicate with one or more smart lightbulbs, to actuate the lighting in a room when a person enters the room. In other words, the IoT has expanded to include many operational technology (OT) networks, as well.

Often, wireless IoT sensor devices are battery-powered, typically using lithium-ion batteries. For instance, lithium thionyl chloride (LTC) batteries are commonly used in IoT sensor devices due to their long battery lives, low self-discharge rates, and their ability to operate at extreme temperatures. However, LTC and similar batteries also build up what is known as a passivation layer over time, when the battery goes without use. Such a layer can degrade the initial voltage that the battery can supply, potentially preventing the IoT sensor device from operating at all.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

Figure 1:
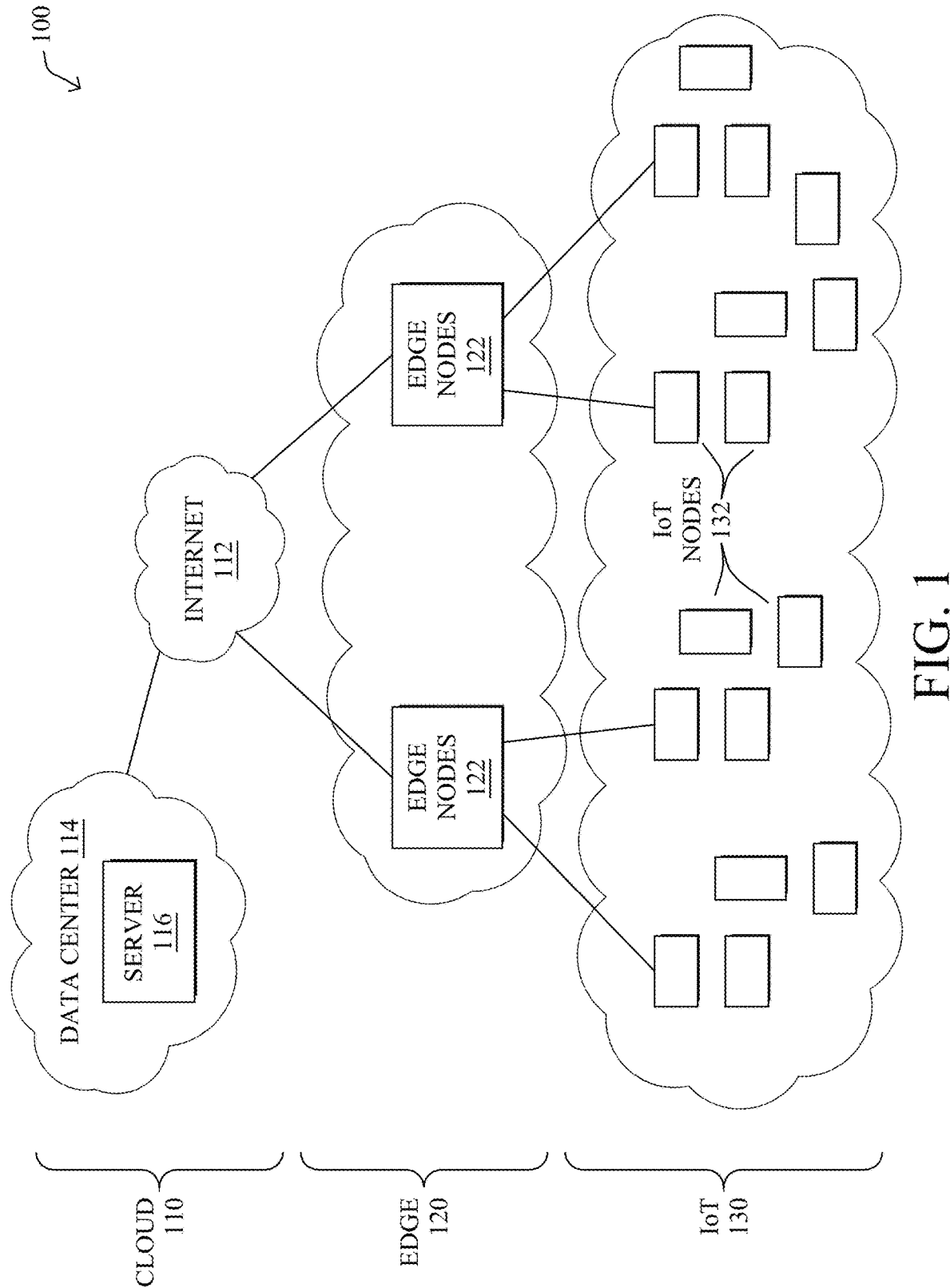
FIG. 1 illustrate an example network.

According to one or more embodiments of the disclosure, a depassivating circuit includes a battery, a resistive load coupled to the battery, and a magnetic field sensor. The magnetic field sensor detects a presence of a magnetic field. The magnetic field sensor depassivates the battery by causing current from the battery to flow through the resistive load, in response to the presence of the magnetic field. The magnetic field sensor detects removal of the magnetic field. The magnetic field sensor ends depassivation of the battery, in response to the removal of the magnetic field.

DESCRIPTION

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC), and others. Other types of networks, such as field area networks (FANs), neighborhood area networks (NANs), personal area networks (PANs), etc. may also make up the components of any given computer network.

In various embodiments, computer networks may include an Internet of Things network. Loosely, the term "Internet of Things" or "IoT" (or "Internet of Everything" or "IoE") refers to uniquely identifiable objects (things) and their virtual representations in a network-based architecture. In particular, the IoT involves the ability to connect more than just computers and communications devices, but rather the ability to connect "objects" in general, such as lights, appliances, vehicles, heating, ventilating, and air-conditioning (HVAC), windows and window shades and blinds, doors, locks, etc. The "Internet of Things" thus generally refers to the interconnection of objects (e.g., smart objects), such as sensors and actuators, over a computer network (e.g., via IP), which may be the public Internet or a private network.

Often, IoT networks operate within a shared-media mesh networks, such as wireless or PLC networks, etc., and are often on what is referred to as Low-Power and Lossy Networks (LLNs), which are a class of network in which both the routers and their interconnect are constrained. That is, LLN devices/routers typically operate with constraints, e.g., processing power, memory, and/or energy (battery), and their interconnects are characterized by, illustratively, high loss rates, low data rates, and/or instability. IoT networks are comprised of anything from a few dozen to thousands or even millions of devices, and support point-to-point traffic (between devices inside the network), point-to-multipoint traffic (from a central control point such as a root node to a subset of devices inside the network), and multipoint-to-point traffic (from devices inside the network towards a central control point).

Edge computing, also sometimes referred to as "fog" computing, is a distributed approach of cloud implementation that acts as an intermediate layer from local networks (e.g., IoT networks) to the cloud (e.g., centralized and/or shared resources, as will be understood by those skilled in the art). That is, generally, edge computing entails using devices at the network edge to provide application services, including computation, networking, and storage, to the local nodes in the network, in contrast to cloud-based approaches that rely on remote data centers/cloud environments for the services. To this end, an edge node is a functional node that is deployed close to IoT endpoints to provide computing, storage, and networking resources and services. Multiple edge nodes organized or configured together form an edge compute system, to implement a particular solution. Edge nodes and edge systems can have the same or complementary capabilities, in various implementations. That is, each individual edge node does not have to implement the entire spectrum of capabilities. Instead, the edge capabilities may be distributed across multiple edge nodes and systems, which may collaborate to help each other to provide the desired services. In other words, an edge system can include any number of virtualized services and/or data stores that are spread across the distributed edge nodes. This may include a master-slave configuration, publish-subscribe configuration, or peer-to-peer configuration.

Low power and Lossy Networks (LLNs), e.g., certain sensor networks, may be used in a myriad of applications such as for "Smart Grid" and "Smart Cities." A number of challenges in LLNs have been presented, such as:

1) Links are generally lossy, such that a Packet Delivery Rate/Ratio (PDR) can dramatically vary due to various sources of interferences, e.g., considerably affecting the bit error rate (BER);
2) Links are generally low bandwidth, such that control plane traffic must generally be bounded and negligible compared to the low rate data traffic;
3) There are a number of use cases that require specifying a set of link and node metrics, some of them being dynamic, thus requiring specific smoothing functions to avoid routing instability, considerably draining bandwidth and energy;
4) Constraint-routing may be required by some applications, e.g., to establish routing paths that will avoid non-encrypted links, nodes running low on energy, etc.;
5) Scale of the networks may become very large, e.g., on the order of several thousands to millions of nodes; and
6) Nodes may be constrained with a low memory, a reduced processing capability, a low power supply (e.g., battery).

In other words, LLNs are a class of network in which both the routers and their interconnect are constrained: LLN routers typically operate with constraints, e.g., processing power, memory, and/or energy (battery), and their interconnects are characterized by, illustratively, high loss rates, low data rates, and/or instability. LLNs are comprised of anything from a few dozen and up to thousands or even millions of LLN routers, and support point-to-point traffic (between devices inside the LLN), point-to-multipoint traffic (from a central control point to a subset of devices inside the LLN) and multipoint-to-point traffic (from devices inside the LLN towards a central control point).

An example implementation of LLNs is an "Internet of Things" network. Loosely, the term "Internet of Things" or "IoT" may be used by those in the art to refer to uniquely identifiable objects (things) and their virtual representations in a network-based architecture. In particular, the next frontier in the evolution of the Internet is the ability to connect more than just computers and communications devices, but rather the ability to connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network. Such devices have been used in the industry for decades, usually in the form of non-IP or proprietary protocols that are connected to IP networks by way of protocol translation gateways. With the emergence of a myriad of applications, such as the smart grid advanced metering infrastructure (AMI), smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

FIG. 1 is a schematic block diagram of an example simplified computer network 100 illustratively comprising nodes/devices at various levels of the network, interconnected by various methods of communication. For instance, the links may be wired links or shared media (e.g., wireless links, PLC links, etc.) where certain nodes, such as, e.g., routers, sensors, computers, etc., may be in communication with other devices, e.g., based on connectivity, distance, signal strength, current operational status, location, etc.

Specifically, as shown in the example IoT network 100, three illustrative layers are shown, namely cloud layer 110, edge layer 120, and IoT device layer 130. Illustratively, the cloud layer 110 may comprise general connectivity via the Internet 112, and may contain one or more datacenters 114 with one or more centralized servers 116 or other devices, as will be appreciated by those skilled in the art. Within the edge layer 120, various edge devices 122 may perform various data processing functions locally, as opposed to datacenter/cloud-based servers or on the endpoint IoT nodes 132 themselves of IoT device layer 130. For example, edge devices 122 may include edge routers and/or other networking devices that provide connectivity between cloud layer 110 and IoT device layer 130. Data packets (e.g., traffic and/or messages sent between the devices/nodes) may be exchanged among the nodes/devices of the computer network 100 using predefined network communication protocols such as certain known wired protocols, wireless protocols, PLC protocols, or other shared-media protocols where appropriate. In this context, a protocol consists of a set of rules defining how the nodes interact with each other.

Those skilled in the art will understand that any number of nodes, devices, links, etc. may be used in the computer network, and that the view shown herein is for simplicity. Also, those skilled in the art will further understand that while the network is shown in a certain orientation, the network 100 is merely an example illustration that is not meant to limit the disclosure.

Data packets (e.g., traffic and/or messages) may be exchanged among the nodes/devices of the computer network 100 using predefined network communication protocols such as certain known wired protocols, wireless protocols (e.g., IEEE Std. 802.15.4, Wi-Fi, Bluetooth®, DECT-Ultra Low Energy, LoRa, etc.), PLC protocols, or other shared-media protocols where appropriate. In this context, a protocol consists of a set of rules defining how the nodes interact with each other.

Figure 2:
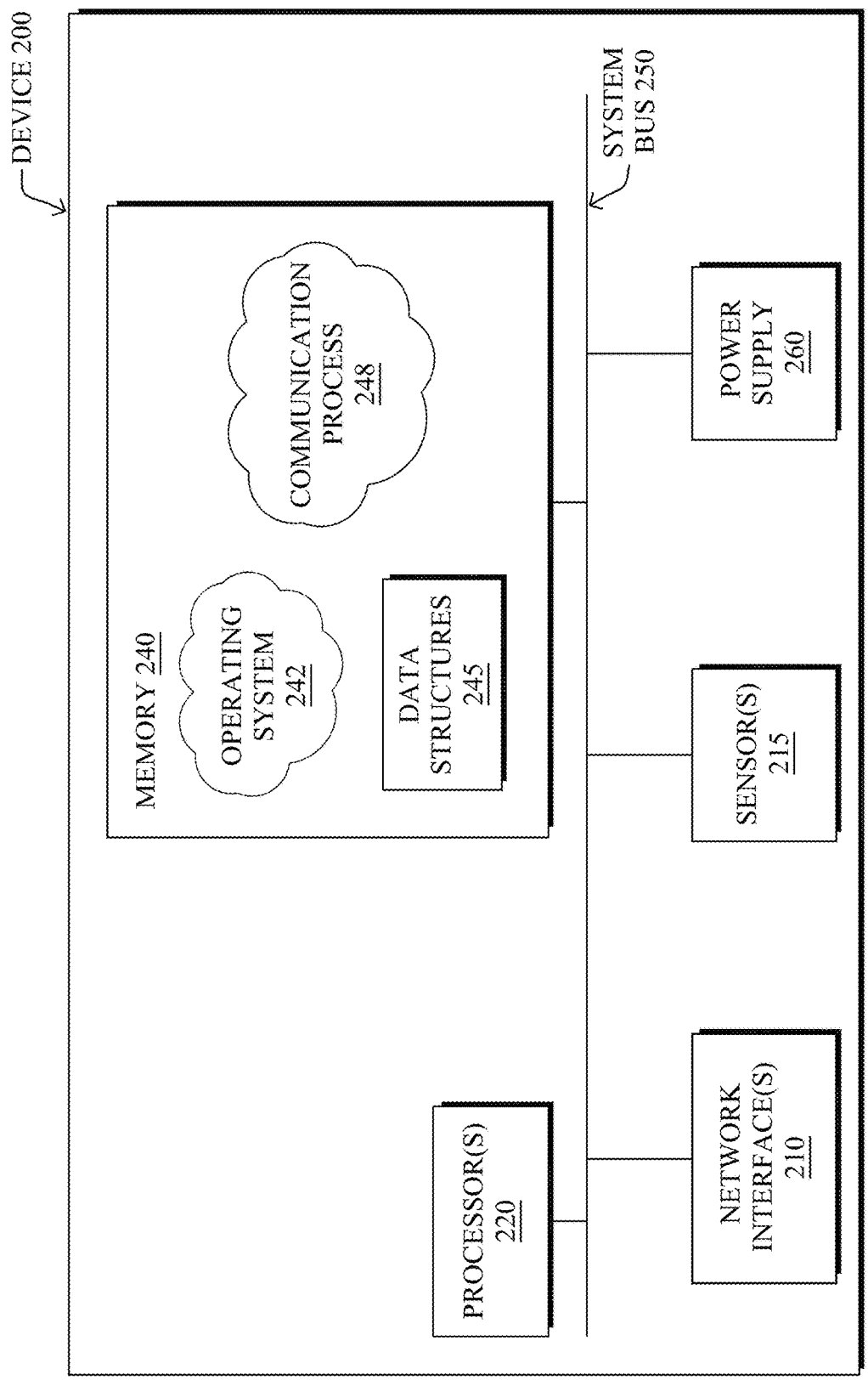
FIG. 2 illustrates an example network device/node.

FIG. 2 is a schematic block diagram of an example node/device 200 (e.g., an apparatus) that may be used with one or more embodiments described herein, e.g., as any of the nodes or devices shown in FIG. 1 above or described in further detail below (e.g., an IoT node 132, etc.). The device 200 may comprise one or more network interfaces 210 (e.g., wired, wireless, PLC, etc.), one or more sensors 215, at least one processor 220, and a memory 240 interconnected by a system bus 250, as well as a power supply 260 (e.g., a battery, a plug-in, etc.).

Network interface(s) 210 include the mechanical, electrical, and signaling circuitry for communicating data over links coupled to the network. The network interfaces 210 may be configured to transmit and/or receive data using a variety of different communication protocols, such as TCP/IP, UDP, etc. Note that the device 200 may have multiple different types of network connections, e.g., wireless and wired/physical connections, and that the view herein is merely for illustration. Also, while the network interface 210 is shown separately from power supply 260, for PLC the network interface 210 may communicate through the power supply 260, or may be an integral component of the power supply. In some specific configurations the PLC signal may be coupled to the power line feeding into the power supply.

Sensor(s) 215 may include one or more sensors configured to measure a physical property of the internal or external environment of device 200. For instance, sensor(s) 215 may include, but are not limited to, any or all of the following: a temperature sensor, a wind sensor, a humidity sensor, a motion sensor, an accelerometer, a pressure sensor, a gas sensor, a smoke sensor, a vibration sensor, or the like.

The memory 240 comprises a plurality of storage locations that are addressable by the processor 220 and the network interfaces 210 for storing software programs and data structures associated with the embodiments described herein. The processor 220 may comprise hardware elements or hardware logic adapted to execute the software programs and manipulate the data structures 245. An operating system 242, portions of which are typically resident in memory 240 and executed by the processor, functionally organizes the device by, among other things, invoking operations in support of software processes and/or services executing on the device. These software processes/services may comprise an illustrative communication process 248, as described herein.

In some embodiments, communication process 248 may be operable to communicate sensor measurements captured by sensor(s) 215 to another device. For instance, in the case of FIG. 1, communication process 248 may send a sensor measurement from sensor(s) 215 to an IoT node 132, to an edge device 122, or the like, for delivery to an edge device 122 or a server 116 for processing. In cases in which power supply 260 comprises a battery, communication process 248 may also be configured to report sensor measurements from sensor(s) 215 at certain times, so as to place device 200 into a sleep mode and conserve power when not reporting sensor measurements. During this sleep mode, device 200 may be completely powered down or, alternatively, network interfaces 210 may be powered down.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

As noted above, wireless IoT sensor devices (e.g., device 200) are battery-powered, typically using lithium-ion batteries. For instance, lithium thionyl chloride (LTC) batteries are commonly used in IoT sensor devices due to their long battery lives, low self-discharge rates, and their ability to operate at extreme temperatures. However, LTC and similar batteries also build up what is known as a passivation layer over time, when the battery goes without use. Such a layer can degrade the initial voltage that the battery can supply, potentially preventing the IoT sensor device from operating at all.

Figure 3:
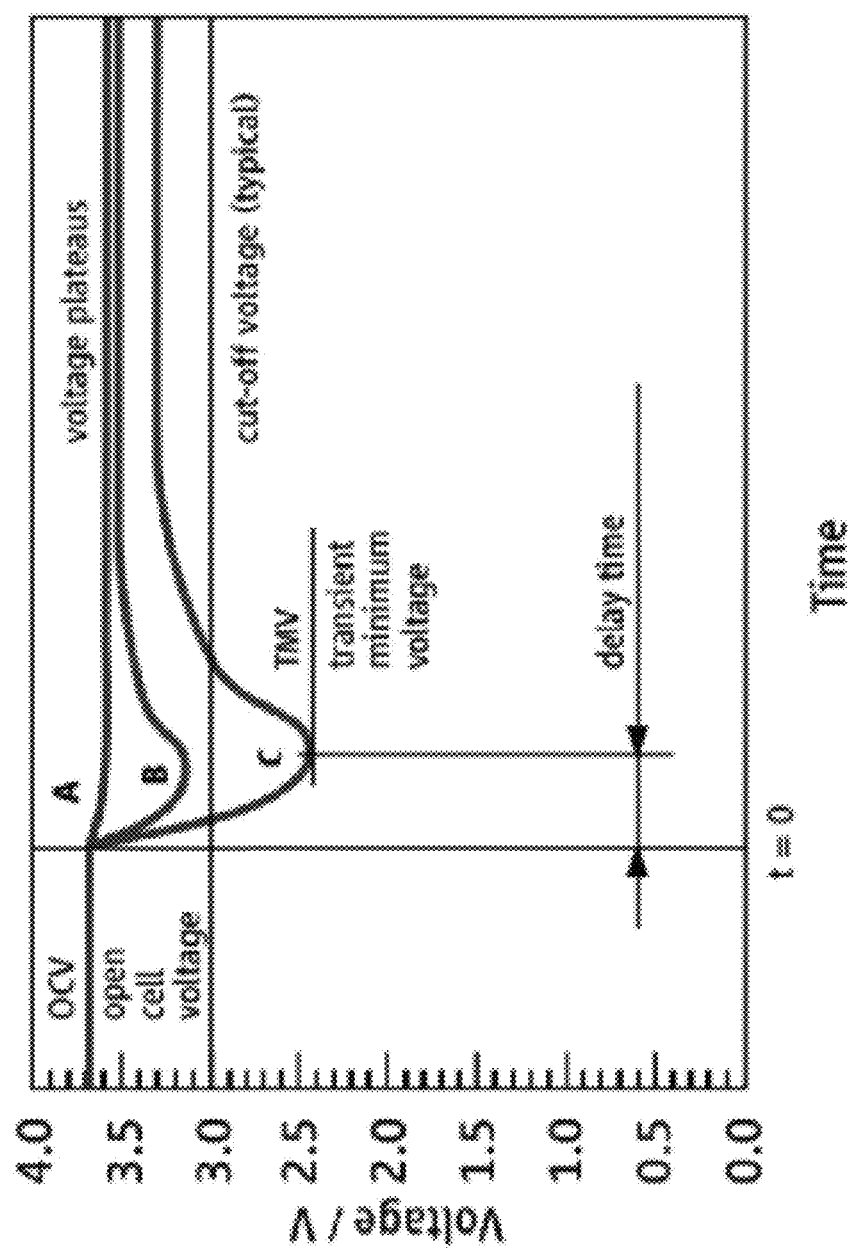
FIG. 3 illustrates an example plot of voltage over time for a battery.

By way of example, FIG. 3 illustrates an example plot 300 of voltage over time for an LTC battery. As shown, the passivation layer that accumulates on an LTC battery will cause its voltage output to temporarily drop from an initial open cell voltage (OCV) for an initial period of time, starting at a time t=0, until reaching a steady state voltage plateau, as the passivation layer is burned away.

As would be appreciated, the discharge current of the battery can greatly affect the voltage curve of the battery. This is illustrated by curves A, B, C in plot 300, which represent increasing amounts of discharge currents. Here, the discharge currents associated with curves A and B are relatively slight, both resulting in a transient drop in the voltage before returning to voltage plateaus that are close to that of the initial OCV.

In contrast, now consider the case of curve C in plot 300, which corresponds to a relatively high discharge current, but typical for an IoT sensor. In such a case, the voltage of the battery may drop during the indicated delay time until it reaches a transient minimum voltage (TMV). Unlike in the cases of curves A and B, though, the TMV of curve C is below the typical cut-off voltage for the device being powered by the battery. This cut-off voltage represents the voltage threshold below which the device can no longer function.

After deployment, passivation of the battery of a sensor device becomes less of a concern, due to the typically periodic use of the sensor device (e.g., waking up, taking a sensor measurement, reporting the measurement, and returning to sleep). However, many such sensor devices also undergo a period of disuse between the time at which they are manufactured and traverse the supply chain to a customer for eventual deployment. Typically, this is on the order of months or even longer, meaning that the battery of the sensor device may already be degraded when it is finally deployed.

One potential solution to the depassivation of the battery of a sensor device prior to deployment would be to have the end-user be responsible for installing the battery. However, many wireless sensor devices are rated to be weather resistant or even waterproof (e.g., IP67 rated, IP68 rated, etc.). In addition to placing additional overhead on the end user, this also means that any opening or closing of the housing of the sensor device increases the potential for its gasketed seal to become deformed, leading to the eventual failure of the sensor device due to exposure to the elements.

Depassivating Circuitry for Sensor Device Batteries

The techniques herein introduce depassivating circuitry for wireless sensor devices and other devices that rely on batteries that form passivation layers over time. In some aspects, the depassivating circuitry introduced herein may be activated when in the presence of a magnetic field. This allows for the battery of a sensor device to be depassivated without having to open its housing, simply by introducing a magnet within proximity of the sensor device.

Illustratively, the techniques described herein may be performed by hardware, software, and/or firmware, such as in accordance with communication process 248, which may include computer executable instructions executed by the processor 220 (or independent processor of interfaces 210) to perform functions relating to the techniques described herein.

Specifically, in various embodiments, a depassivating circuit includes a battery, a resistive load coupled to the battery, and a magnetic field sensor. The magnetic field sensor detects a presence of a magnetic field. The magnetic field sensor depassivates the battery by causing current from the battery to flow through the resistive load, in response to the presence of the magnetic field. The magnetic field sensor detects removal of the magnetic field. The magnetic field sensor ends depassivation of the battery, in response to the removal of the magnetic field.

Figure 4:
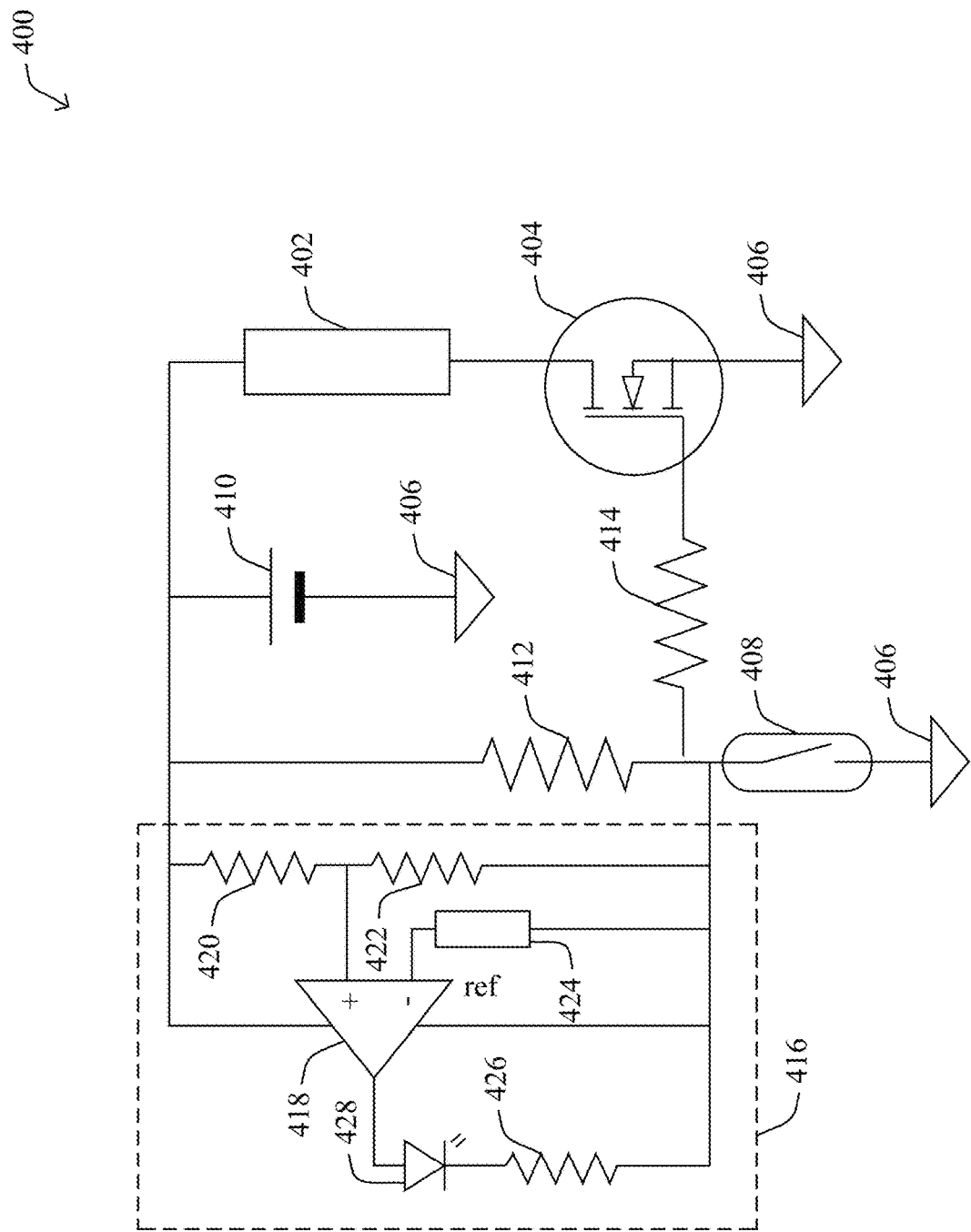
FIG. 4 illustrates an example depassivating circuit.

Operationally, FIG. 4 illustrates an example depassivating circuit 400, according to various embodiments. In various embodiments, depassivating circuit 400 may be integrated into a sensor device (e.g., device 200) or another device that uses a battery that forms a passivation layer over time. More specifically, as shown, depassivating circuit 400 may be coupled to sensor circuitry 402 or another device load, that is powered by a battery 410. Such sensor circuitry 402 may include one or more sensors (e.g., sensor(s) 215 in FIG. 2) and/or other circuitry that powered by battery 410 (e.g., processor(s) 220, memory 230, network interface(s) 210, etc.).

According to various embodiments, at the core of depassivating circuit 400 is a resistive load 412 that is coupled to battery 410, as well as a magnetic field sensor 408. Typically, resistive load 412 may take the form of a single resistor located between magnetic field sensor 408 and battery 410. However, in other embodiments, resistive load 412 may take the form of multiple resistors.

Generally, magnetic field sensor 408 may take the form of any electrical component or circuitry that is configured to close an electrical connection when it detects the presence of a magnetic field and open that connection when the magnetic field is not present or removed. For instance, in a simple implementation, magnetic field sensor 408 may take the form of a reed switch, as shown, which remains electrically open until closed by a magnetic field. However, other magnetic field sensors such as a Hall effect sensor, or the like, could also be used to implement the same functionality. Of course, magnetic field sensor 408 may also be configured to only activate or deactivate in the presence of a suitably strong magnetic field (e.g., above a threshold), so as to prevent unwanted activation or deactivation of depassivating circuit 400, the exact parameters of which may be selected as desired without deviating from the teachings herein.

As shown, both magnetic field sensor 408 and battery 410 may be connected to a ground 406. Thus, when magnetic field sensor 408 is not in the presence of a magnetic field and in an open configuration, current will not flow from battery 410 through resistive load 412 and magnetic field sensor 408, as this forms an open circuit. This prevents depassivating circuit 400 from draining battery 410 until such a time as it is subjected to a magnetic field and activated.

Both magnetic field sensor 408 and battery 410 may be electrically connected to a ground 406. Thus, when a suitable magnetic field is applied to magnetic field sensor 408, it will enter into its closed configuration, thereby closing the circuit. As a result, current will begin to flow from battery 410 through resistive load 412 and magnetic field sensor 408. Doing so will have a depassivating effect on battery 410, essentially 'burning off' its passivation layer that it has accumulated over time.

To prevent current from flowing through circuitry 402, depassivating circuit 400 may also include a switch 404 that is also activated when magnetic field sensor 408 is in the presence of a magnetic field. For instance, as shown, switch 404 may take the form of a metal-oxide-semiconductor field effect transistor (MOSFET), another form of transistor, or the like, that is used to electrically isolate circuitry 402 when battery 410 is being depassivated. For instance, in the case of a MOSFET, switch 404 may selectively connect circuitry 402 to ground 406 and controlled through the application of a voltage to it.

More specifically, as shown, magnetic field sensor 408 being in its closed configuration may cause a voltage to be applied across switch 404, thereby opening switch 404 and isolating circuitry 402 from battery 410. An input resistor 414 may be coupled to both magnetic field sensor 408 and switch 404 and sized to provide the appropriate input signal to switch 404 to activate it. Conversely, removal of the magnetic field from magnetic field sensor 408 will cause the input voltage to switch 404 to be removed, leading to battery 410 again supplying power to circuitry 402.

In various embodiments, depassivating circuit 400 may also optionally include an indication portion 416 that is configured to provide a visual indication of the status of the depassivation process. To this end, indication portion 416 may include a light emitting diode (LED) 428 that is coupled to an operational amplifier 418, in some embodiments. Generally, indication portion 416 may be connected to battery 410 in parallel with resistive load 412 and is used to evaluate the voltage supplied by battery 410.

As can be seen in FIG. 3, there will be an initial drop in voltage when battery 410 supplies current to resistive load 412, which will eventually return to a voltage plateau that is relatively close to its open cell voltage. Thus, operational amplifier 418 may be coupled to appropriately selected resistors 420-426, to activate LED 428 when the voltage from battery 410 has stabilized above a selected threshold. If LED 428 protrudes from the housing of the sensor device, or an aperture is formed in the housing above LED 428, this may indicate to the user when battery 410 has been depassivated. In turn, the user can remove the magnetic field from magnetic field sensor 408 at an appropriate time, thereby ending the depassivating of battery 410.

Figure 5:
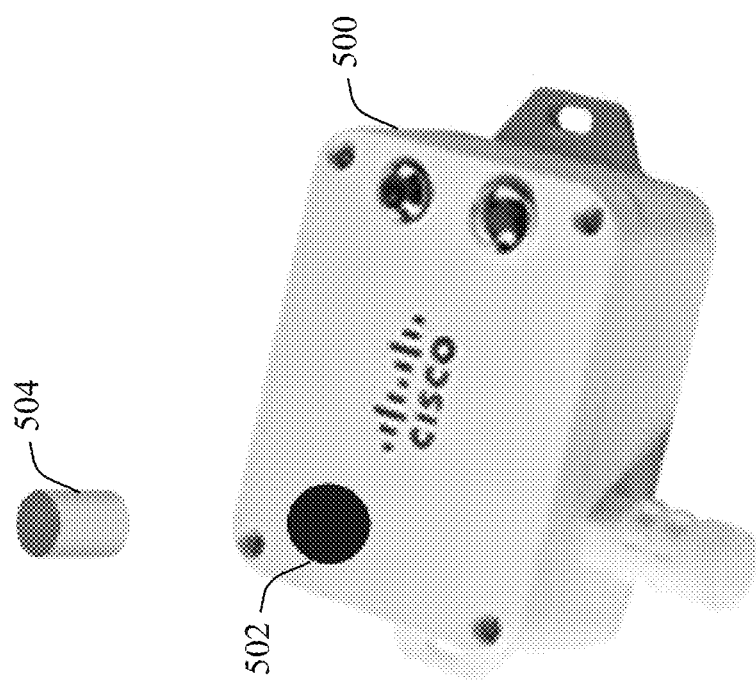
FIG. 5 illustrates an example sensor device having a depassivating circuit.

FIG. 5 illustrates an example sensor device 500 having a depassivating circuit, according to various embodiments. As shown, an indication 502 may be located on the external housing of sensor device 500 that indicates the location of the magnetic field sensor of its depassivating circuit. To activate the depassivating circuit, a user may place a magnet 504 against or in close proximity to indication 502. So long as magnet 504 remains in close proximity to this area, the battery of sensor device 500 will undergo depassivation.

After a period of time, the user may opt to end the depassivation of the battery of sensor device 500 by simply removing magnet 504 from being in proximity of indication 502. In such a case, the magnetic field sensor of sensor device 500 will detect the removal of the magnetic field of magnet 504 and end the depassivation process. In more complex implementations, an LED or other indicator could also be integrated into the depassivating circuit of sensor device 500, to alert the user as to when the battery of sensor device 500 has been depassivated and magnet 504 can be removed.

Figure 6:
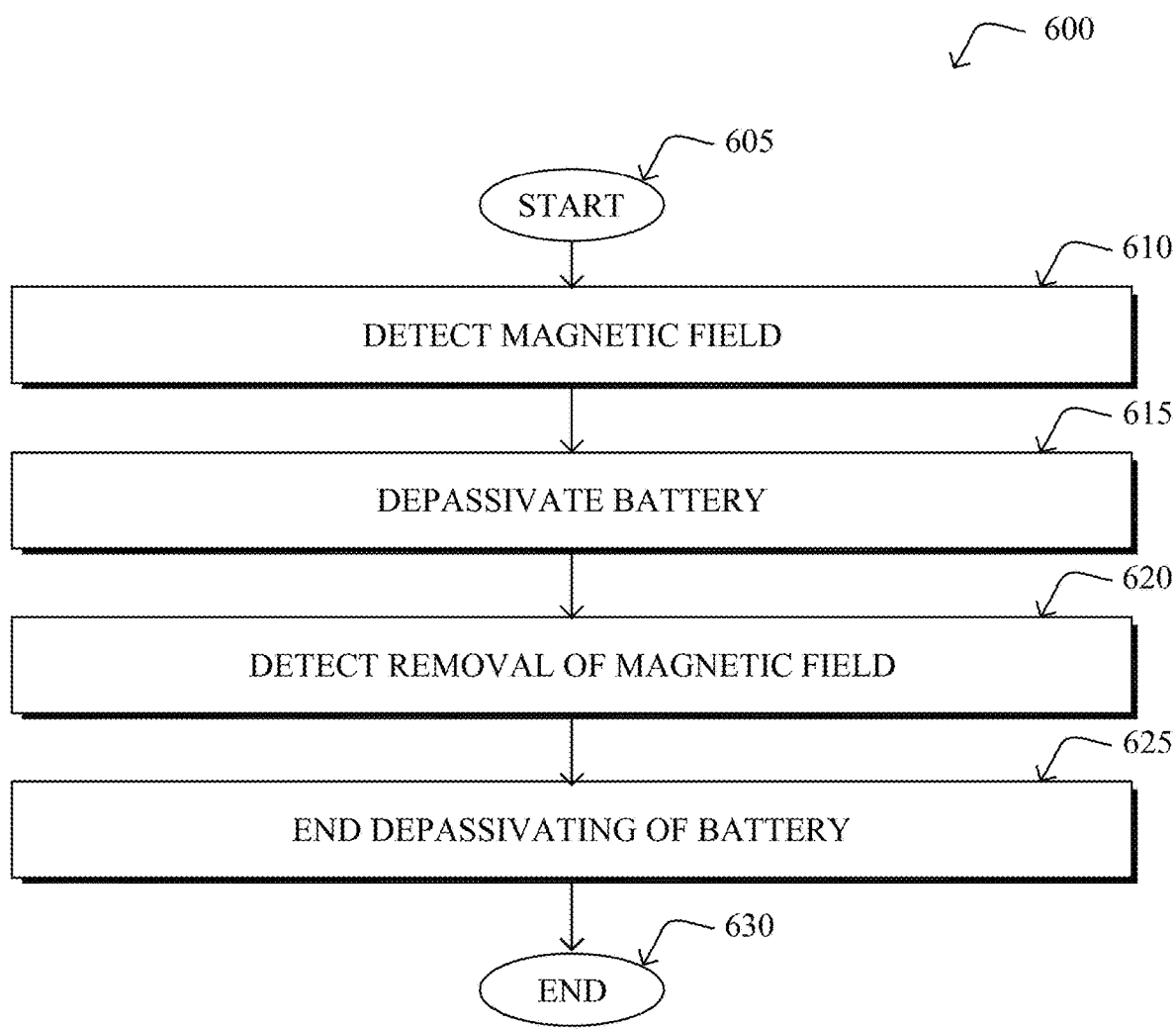
FIG. 6 illustrates an example simplified procedure for depassivating a battery.

FIG. 6 illustrates an example simplified procedure for depassivating a battery, in accordance with one or more embodiments described herein. The procedure 600 may start at step 605, and continues to step 610, where, as described in greater detail above, a depassivating circuit, such as one integrated into a sensor device (e.g., device 200), may detect presence of a magnetic field. In one embodiment, the depassivating circuit comprises a reed switch that detects the presence of the magnetic field and the removal of the magnetic field.

At step 615, as detailed above, the depassivating circuit may depassivate a battery coupled to the depassivating circuit, in response to the presence of the magnetic field. In some embodiments, the depassivating circuit comprises a resistive load. In such cases, the depassivating circuit may depassivate the battery by causing current to flow from the battery through the resistive load. In various embodiments, the battery is a lithium battery, such as a lithium thionyl chloride (LTC) battery. In further embodiments, the depassivating circuit also comprises a metal-oxide-semiconductor field effect transistor (MOSFET) and is coupled to sensor circuitry. In such cases, the depassivating circuit may also electrically isolating, by the MOSFET, the sensor circuitry during the depassivating of the battery.

At step 620, the depassivating circuit may detect removal of the magnetic field, as described in greater detail above. For instance, the reed switch, Hall effect sensor, or the like, of the circuit may detect when the magnetic field has been removed.

At step 625, as detailed above, the depassivating circuit may end the depassivating of the battery, in response to the removal of the magnetic field. In some embodiments, the circuit may also include a light emitting diode (LED). In such cases, the circuit may detect that the battery has been depassivated and provide, via the LED, an indication that the battery has been depassivated. In such cases, the circuit may also include an operational amplifier coupled to the LED that detects that the battery has been depassivated based on a voltage supplied by the battery.

Procedure 600 then ends at step 630.

It should be noted that while certain steps within procedure 600 may be optional as described above, the steps shown in FIG. 6 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly, this description is to be taken only by way of example and not to otherwise limit the scope of the embodiments herein. Therefore, it is the object of the appended claims to cover all such variations and modifications as come within the true intent and scope of the embodiments herein.

What is claimed is:

1. A depassivating circuit comprising:
    a battery;
    a resistive load coupled to the battery; and
    a magnetic field sensor that without using a processor:
        detects a presence of a magnetic field;
        depassivates the battery by causing current from the battery to flow through the resistive load, in response to the presence of the magnetic field;
        detects removal of the magnetic field; and
        ends depassivation of the battery, in response to the removal of the magnetic field.

2. The depassivating circuit as in claim 1, wherein the magnetic field sensor comprises a reed switch.

3. The depassivating circuit as in claim 1, wherein the magnetic field sensor comprises a Hall-effect sensor.

4. The depassivating circuit as in claim 1, wherein the battery is a lithium battery.

5. The depassivating circuit as in claim 4, wherein the battery is a lithium thionyl chloride (LTC) battery.

6. The depassivating circuit as in claim 1, further comprising:
    an operational amplifier that detects when the battery has been depassivated.

7. The depassivating circuit as in claim 6, further comprising:
    a light emitting diode (LED) coupled to the operational amplifier that provides a visual indication when the battery has been depassivated.

8. The depassivating circuit as in claim 1, further comprising:
    a metal-oxide-semiconductor field effect transistor (MOSFET).

9. The depassivating circuit as in claim 8, wherein the MOSFET is coupled to sensor circuitry and electrically isolates the sensor circuitry during depassivation of the battery.

10. A method comprising:
    detecting, by a depassivating circuit without using a processor, presence of a magnetic field;
    depassivating, by the depassivating circuit, a battery coupled to the depassivating circuit, in response to the presence of the magnetic field;
    detecting, by the depassivating circuit, removal of the magnetic field; and
    ending, by the depassivating circuit, the depassivating of the battery, in response to the removal of the magnetic field.

11. The method as in claim 10, wherein the depassivating circuit comprises a reed switch that detects the presence of the magnetic field and the removal of the magnetic field.

12. The method as in claim 10, wherein the depassivating circuit comprises a resistive load, and wherein depassivating the battery comprises:
    causing current to flow from the battery through the resistive load.

13. The method as in claim 10, wherein the battery is a lithium battery.

14. The method as in claim 13, wherein the battery is a lithium thionyl chloride (LTC) battery.

15. The method as in claim 10, wherein the depassivating circuit comprises a light emitting diode (LED), and wherein the method further comprises:
    detecting, by the depassivating circuit, that the battery has been depassivated; and
    providing, via the LED, an indication that the battery has been depassivated.

16. The method as in claim 15, wherein the depassivating circuit further comprises an operational amplified coupled to the LED that detects that the battery has been depassivated based on a voltage supplied by the battery.

17. The method as in claim 10, wherein the depassivating circuit comprises a metal-oxide-semiconductor field effect transistor (MOSFET), wherein the depassivating circuit is coupled to sensor circuitry, and wherein the method further comprises:
    electrically isolating, by the MOSFET, the sensor circuitry during the depassivating of the battery.

18. The method as in claim 10, wherein the depassivating circuit comprises a Hall-effect sensor that detects the presence of the magnetic field and the removal of the magnetic field.

19. A wireless sensor device comprising:
    sensor circuitry that includes one or more sensors;
    a battery;
    a resistive load coupled to the battery; and
    a magnetic field sensor that without using a processor:

detects a presence of a magnetic field;
depassivates the battery by causing current from the battery to flow through the resistive load, in response to the presence of the magnetic field;
detects removal of the magnetic field; and
ends depassivation of the battery, in response to the removal of the magnetic field.

20. The wireless sensor device as in claim 19, further comprising:
a housing having an indication of a location of the magnetic field sensor.

* * * * *